United States Patent
Siniaguine

(10) Patent No.: US 6,882,030 B2
(45) Date of Patent: Apr. 19, 2005

(54) INTEGRATED CIRCUIT STRUCTURES WITH A CONDUCTOR FORMED IN A THROUGH HOLE IN A SEMICONDUCTOR SUBSTRATE AND PROTRUDING FROM A SURFACE OF THE SUBSTRATE

(75) Inventor: Oleg Siniaguine, San Carlos, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 129 days.

(21) Appl. No.: 10/059,898

(22) Filed: Jan. 28, 2002

(65) Prior Publication Data

US 2002/0084513 A1 Jul. 4, 2002

Related U.S. Application Data

(63) Continuation-in-part of application No. 09/466,535, filed on Dec. 17, 1999, which is a division of application No. 09/083,927, filed on May 22, 1998, now Pat. No. 6,184,060, which is a continuation of application No. PCT/US97/18979, filed on Oct. 27, 1997.
(60) Provisional application No. 60/030,425, filed on Oct. 29, 1996.

(51) Int. Cl.$^7$ .................. H01L 29/40; H01L 23/04; H01L 23/48
(52) U.S. Cl. .................. 257/621; 257/698; 257/735; 257/777
(58) Field of Search .................. 257/621, 698, 257/735, 737, 690, 699, 685, 686, 777–783; 438/106, 411, 461, 611, 667, 108, 109

(56) References Cited

U.S. PATENT DOCUMENTS

| 3,761,782 A | 9/1973 | Youmans | 257/778 |
| 3,838,501 A | 10/1974 | Umbaugh | 29/583 |
| 4,141,135 A | 2/1979 | Henry | 29/580 |

(Continued)

FOREIGN PATENT DOCUMENTS

| DE | 19707887 | 9/1998 |
| EP | 0238089 | 3/1987 |

(Continued)

OTHER PUBLICATIONS

Siniaguine, Oleg, "Plasma Jet Etching at Atmospheric Pressure for Semiconductor Production," 1996 1" Inernational Symposium on Plasma Process–Induced Damage, May 13–14, 1996 Santa Clara, CA pp. 151–153.

Siniaguine, Oleg, "Plasma Jet Etching at Atmospheric Pressure for Semiconductor Production", May 14, 1996, pp. 151–153.

Primary Examiner—Hung Vu
(74) Attorney, Agent, or Firm—Michael Shenker; MacPherson Kwok Chen & Heid LLP

(57) ABSTRACT

To fabricate contacts on a wafer backside, openings (124) are formed in the face side of the wafer (104). A dielectric layer (140) and some contact material (150), e.g. metal, are deposited into the openings. Then the backside is etched until the contacts (150C) are exposed and protrude out. The protruding portion of each contact has an outer sidewall (150V). At least a portion of the sidewall is vertical or sloped outwards with respect to the opening when the contact is traced down. The contact is soldered to an another structure (410), e.g. a die or a PCB. The solder (420) reaches and at least partially covers the sidewall portion which is vertical or sloped outwards. The strength of the solder bond is improved as a result. The dielectric layer protrudes around each contact. The protruding portion (140P) of the dielectric becomes gradually thinner around each contact in the downward direction. The thinned dielectric is more flexible, and is less likely detach from the contact when the contact is pulled sideways. Other embodiments are also described.

4 Claims, 5 Drawing Sheets

U.S. PATENT DOCUMENTS

| | | | |
|---|---|---|---|
| 4,368,106 A | 1/1983 | Anthony | 204/15 |
| 4,394,712 A | 7/1983 | Anthony | 361/411 |
| 4,463,336 A | 7/1984 | Black et al. | 338/4 |
| 4,628,174 A | 12/1986 | Anthony | 219/76.13 |
| 4,729,971 A | 3/1988 | Coleman | 437/226 |
| 4,769,738 A | 9/1988 | Nakamura et al. | 361/283 |
| 4,807,021 A | 2/1989 | Okumura | 357/75 |
| 4,822,755 A | 4/1989 | Hawkins et al. | 437/227 |
| 4,842,699 A | 6/1989 | Hua et al. | 204/15 |
| 4,897,708 A | 1/1990 | Clements | 357/65 |
| 4,939,568 A | 7/1990 | Kato et al. | 357/75 |
| 4,954,458 A | 9/1990 | Reid | 437/51 |
| 4,978,639 A | 12/1990 | Hua et al. | 437/230 |
| 4,996,587 A | 2/1991 | Hinrichsmeyer et al. | 357/74 |
| 5,024,970 A | 6/1991 | Mori | 437/226 |
| 5,071,792 A | 12/1991 | VanVonno et al. | 437/227 |
| 5,135,878 A | 8/1992 | Bartur | 437/39 |
| 5,166,097 A | 11/1992 | Tanielian | 437/203 |
| 5,191,405 A | 3/1993 | Tomita et al. | 257/777 |
| 5,225,771 A | 7/1993 | Leedy | 324/158 P |
| 5,229,647 A | 7/1993 | Gnadinger | 257/785 |
| 5,270,261 A | 12/1993 | Bertin et al. | 437/209 |
| 5,322,816 A | 6/1994 | Pinter | 437/203 |
| 5,323,035 A | 6/1994 | Leedy | 257/248 |
| 5,340,771 A | 8/1994 | Rostoker | 437/209 |
| 5,453,404 A | 9/1995 | Leedy | 437/203 |
| 5,463,246 A | 10/1995 | Matsunami | 257/621 |
| 5,472,914 A | 12/1995 | Martin et al. | 437/209 |
| 5,478,781 A | 12/1995 | Bertin et al. | 437/209 |
| 5,489,554 A | 2/1996 | Gates | 437/208 |
| 5,494,832 A | 2/1996 | Lehmann et al. | 437/2 |
| 5,502,333 A | 3/1996 | Bertin et al. | 257/685 |
| 5,502,667 A | 3/1996 | Bertin et al. | 365/51 |
| 5,504,036 A | 4/1996 | Dekker et al. | 437/183 |
| 5,506,753 A | 4/1996 | Bertin et al. | |
| 5,517,057 A | 5/1996 | Beilstein, Jr. et al. | 257/686 |
| 5,517,754 A | 5/1996 | Beilstein, Jr. et al. | 29/840 |
| 5,532,519 A | 7/1996 | Bertin et al. | 257/727 |
| 5,550,942 A | 8/1996 | Sheem | 385/53 |
| 5,561,622 A | 10/1996 | Bertin et al. | 365/51 |
| 5,563,086 A | 10/1996 | Bertin et al. | 437/52 |
| 5,567,653 A | 10/1996 | Bertin et al. | 437/173 |
| 5,567,654 A | 10/1996 | Beilstein, Jr. et al. | 437/209 |
| 5,571,754 A | 11/1996 | Bertin et al. | 437/209 |
| 5,627,106 A | 5/1997 | Hsu | 438/438 |
| 5,654,127 A | 8/1997 | Leedy | 430/315 |
| 5,691,248 A | 11/1997 | Cronin et al. | 437/227 |
| 5,766,984 A | 6/1998 | Ramm et al. | 438/109 |
| 5,767,001 A | 6/1998 | Bertagnolli et al. | 438/455 |
| 5,824,595 A | 10/1998 | Igel et al. | 438/464 |
| 5,858,256 A | 1/1999 | Minne et al. | 216/24 |
| 5,888,883 A | 3/1999 | Sasaki et al. | 438/460 |
| 5,969,426 A * | 10/1999 | Baba et al. | 257/778 |
| 6,036,872 A | 3/2000 | Wood et al. | 216/2 |
| 6,083,811 A | 7/2000 | Riding et al. | 438/460 |
| 6,184,060 B1 | 2/2001 | Siniaguine | 438/106 |

FOREIGN PATENT DOCUMENTS

| | | |
|---|---|---|
| EP | 0807964 | 11/1997 |
| JP | 60-7149 | 1/1985 |
| JP | 60-007149 | 1/1985 |
| JP | 62219954 | 9/1987 |
| JP | 62-219954 | 9/1987 |
| JP | 04025122 | 1/1992 |
| JP | 04-025122 | 1/1992 |
| JP | 4-133472 | 5/1992 |
| JP | 08-502146 | 3/1996 |
| WO | 92/03848 | 3/1992 |
| WO | WO 94/09513 | 4/1994 |
| WO | 94/09513 | 4/1994 |
| WO | 94/25981 | 10/1994 |
| WO | WO 97/45856 | 12/1997 |

* cited by examiner

INTEGRATED CIRCUIT STRUCTURES WITH A CONDUCTOR FORMED IN A THROUGH HOLE IN A SEMICONDUCTOR SUBSTRATE AND PROTRUDING FROM A SURFACE OF THE SUBSTRATE

CROSS-REFERENCE TO RELATED APPLICATIONS

The present application is a continuation-in-part of U.S. patent application Ser. No. 09/466,535 filed Dec. 17, 1999, incorporated herein by reference, which is a division of U.S. patent application Ser. No. 09/083,927 filed May 22, 1998, now U.S. Pat. No. 6,184,060, incorporated herein by reference, which is a continuation of international application PCT/US97/18979, with an international filing date of Oct. 27, 1997, which is incorporated herein by reference, which claims priority of U.S. provisional application No. 60/030,425 filed Oct. 29, 1996.

BACKGROUND OF THE INVENTION

The present invention relates to integrated circuits.

SUMMARY

In some embodiments of the present invention, one or more openings are formed in an active side of a semiconductor wafer, a dielectric is formed in the openings, and a conductor (e.g. metal) is formed in the openings over the dielectric. Then the wafer is etched from the backside to expose the conductor. The openings become through holes, and the exposed conductor provides contacts protruding from the through holes. Each contact has a protruding outer surface not covered by the dielectric. At least a portion of the outer surface is either vertical or is sloped outwards (laterally away from the corresponding through hole) when the surface is traced in the direction away from the wafer. The protruding contacts are soldered to some substrate (e.g. another wafer or a printed circuit board). The solder reaches and at least partially covers the contacts' surface that is vertical or sloped outwards. Consequently, the strength of the solder bond is increased.

In some embodiments, the dielectric forms a protrusion around each contact. Throughout the protrusion, the dielectric becomes gradually thinner around each contact as the dielectric is traced in the direction away from the wafer. The thinner dielectric is more flexible, and therefore is less likely to detach from the contact if the contact is pulled sideways.

Other embodiments and variations are within the scope of the invention. The invention is defined by the appended claims.

DESCRIPTION OF SOME EMBODIMENTS

In this section, the particular materials, dimensions, processes, process sequences, and other details are provided for illustration and not to limit the invention.

Figure 1:
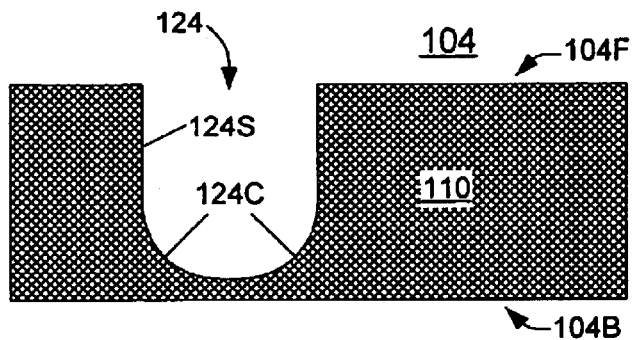
FIGS. 1–3 illustrate cross sections of an integrated circuit in the process of fabrication.

FIG. 1 shows a semiconductor wafer 104 in an integrated circuit fabrication process. Wafer 104 includes a semiconductor substrate 110 made of monocrystalline silicon or some other semiconductor material. Transistors, capacitors, resistors, and other circuit elements (not shown), may have been formed in the wafer in, above and/or below the substrate. In some embodiments, the top (or front) side 104F of wafer 104 is an "active" side which includes, or will include, the circuit elements mentioned above. The top portion of substrate 110 will include active areas for transistors and other devices. The backside 104B is a non-active side. Alternatively, some circuit elements may be located at backside 104B. Such elements may be formed after the backside etch of wafer 104 described below with reference to FIG. 3. The particular location and structure of the circuit elements do not limit the invention.

One or more openings 124 are formed in the top surface of substrate 110. If other layers (not shown) have been formed on the top surface, these layers are removed at the location of openings 124 when the openings are formed. Sidewalls 124S of openings 124 are vertical or have a vertical portion. In some embodiments, the entire sidewalls are vertical except at the bottom corners 124C. The corners may be sloped and/or rounded. Openings 124 can be formed by a masked anisotropic etch using known technology. Suitable anisotropic reactive ion etching equipment is available from Surface Technology Systems plc of the United Kingdom. See also U.S. Pat. No. 6,184,060 issued Feb. 6, 2001 to O. Siniaguine, and U.S. Pat. No. 6,322,903 issued Nov. 27, 2001 to O. Siniaguine et al., both incorporated herein by reference.

Dielectric layer 140 (FIG. 2) is formed on the semiconductor surface in openings 124. Dielectric 140 can be BPSG or undoped silicon dioxide formed by thermal oxidation or chemical vapor deposition (CVD). See the aforementioned U.S. Pat. Nos. 6,184,060 and 6,322,903. An exemplary thickness of dielectric 140 is 1–2 $\mu$m. Other dielectric materials, fabrication processes and dimensions can also be used.

Dielectric 140 can be patterned outside of openings 124 as needed to form circuit elements.

Conductive layer 150 is formed in openings 124 on dielectric 140. Layer 150 will be used to provide backside contacts on wafer 104. In some embodiments, layer 150 is metal. In some embodiments, layer 150 is a solderable metal, or a combination of conductive layers with the bottom layer being solderable metal. Solderable metals include copper, gold, nickel, zinc, chromium, vanadium, palladium, tin/lead, tin/indium, tin/silver, tin/bismuth, or their alloys and combinations, as known in the art. An exemplary thickness of layer 150 is a 0.8–1.2 $\mu$m (e.g. 1 $\mu$m). Other materials and dimensions, known or to be invented, can also be used.

Outer sidewalls 150V of layer 150 in openings 124 are vertical or include a vertical portion. In some embodiments, the entire sidewalls are vertical except at the bottom corners.

A filler 160, for example, a metal, silicon dioxide, or some other material, is formed optionally in openings 124 to increase the mechanical strength of the structure and/or improve heat dissipation. Filler 160 completely or partially fills the openings. Filler 160 can be a tungsten plug for example. In some embodiments, filler 160 and conductive layer 150 are a single layer formed from the same material in a single deposition step.

Layers 150, 160 can be patterned as needed to form other circuit elements.

Figure 2:
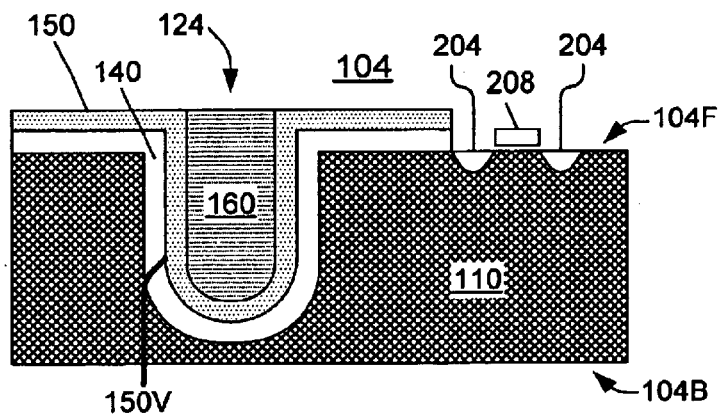

The fabrication steps described above can be combined with other steps to form integrated circuit elements. For illustration, FIG. 2 shows one such element, a MOS transistor. The transistor has source/drain regions 204 formed in the top surface of substrate 110, a channel region between the source/drain regions, and a gate 208 overlying the channel region and separated therefrom by a gate dielectric. Layer 150 in opening 124 can be connected to a source drain region 204, a gate 208, or other circuit elements. Other integrated circuit dies or wafers can be attached to the top of wafer 104. See the aforementioned U.S. Pat. Nos. 6,184,060 and 6,322,903.

Figure 3:
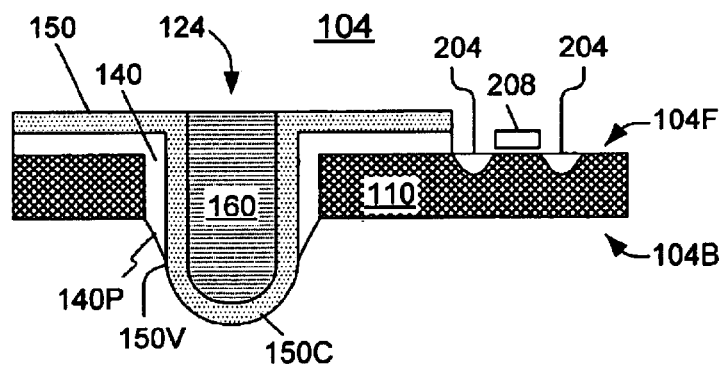

As shown in FIG. 3, backside processing of wafer 104 exposes the conductive layer 150 on the bottom of the wafer. Suitable processes are described in the aforementioned U.S. Pat. Nos. 6,184,060 and 6,322,903. For example, if the substrate 110 is silicon and the dielectric 140 is doped or undoped silicon dioxide and if layer 150 is a suitable metal, the layer 150 can be exposed by an atmospheric pressure plasma etch using $CF_4$. When oxide 140 becomes exposed, the oxide and the silicon 110 are etched simultaneously. Silicon 110 is etched faster than oxide 140. Therefore, at the end of the etch, the oxide 140 protrudes down from the bottom surface of substrate 110 around the exposed contact portions 150C of layer 150. The protrusions of dielectric 140 will help to insulate the silicon substrate from the solder when the contacts 150C are soldered to another structure (see FIG. 4).

Figure 4:
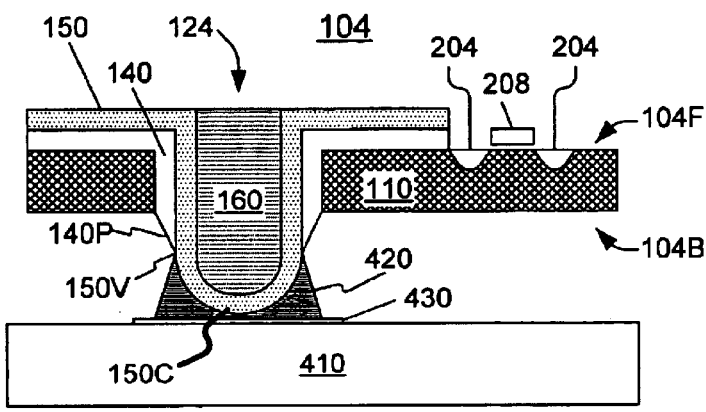
FIG. 4 illustrates a cross section of an integrated circuit attached to a substrate.

When dielectric 140 is exposed during the backside etch, it is etched both vertically and horizontally. The horizontal etch rate may or may not be the same as the vertical etch rate. Due to the horizontal etching, dielectric 140 is thinned around the layer 150. The exposed part of dielectric 140 is shown at 140P. The lower portions of dielectric 140P are exposed earlier, and therefore etched longer, than the higher portions. Consequently, at the end of the etch, dielectric 140P is thinner at the bottom. The entire protruding portion 140P becomes gradually thinner as it is traced down from substrate 110. As a result, the protruding portion 140P is more flexible at the bottom, and is less likely to be detached from contact 150C if the contact is pulled sideways. The contact can be pulled sideways after being bonded to a substrate 410 (FIG. 4). The contact can be pulled sideways due to thermal expansion/contraction or during handling.

The backside etch of substrate 110 and dielectric 140 exposes the vertical sidewall 150V of layer 150. In some embodiments, dielectric 140 protrudes down from substrate 110 by at least 1–2 $\mu$m when measured vertically. Contacts 150C protrude down below the dielectric by about 1–100 $\mu$m or more. Vertical sidewall portions 150V protrude down by about 1–100 $\mu$m or more below dielectric 140. These dimensions are exemplary and not limiting.

The exposed contacts 150C are soldered to substrate 410 (FIG. 4) with solder 420. Substrate 410 can be a wiring substrate, e.g. a printed circuit board or an intermediate packaging substrate such as used in ball grid array packaging or other packaging types. Substrate 410 can also be an integrated circuit die or wafer, or a stack of such dies or wafers. Wafer 104 can be diced before attachment to substrate 410, and individual dies can be attached to substrate or substrates 410.

Solder 420 is deposited on contacts 430 formed at the top surface of substrate 410, or the solder can be deposited on backside contacts 150C, or both. The solder can be tin or its alloys as known in the art. Conductive material 150 is solder wettable, or includes a solder wettable layer as the bottom layer. Alternatively, before the solder is deposited, the contacts 150C can be covered with a solder wettable material (by electroplating, for example).

Figure 5:
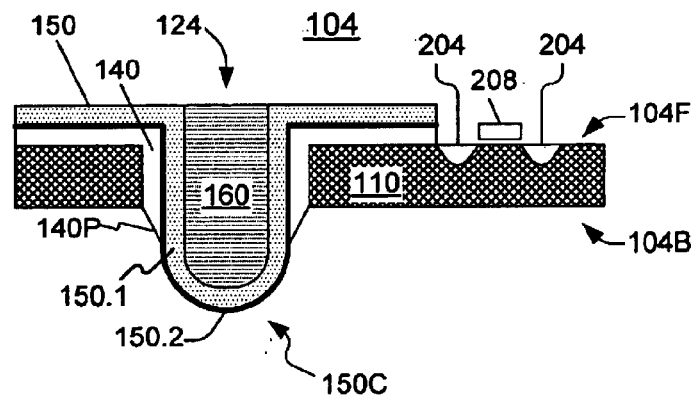
FIGS. 5–7 illustrate cross sections of integrated circuits in the process of fabrication.

In FIG. 5, layer 150 includes a solder wettable layer (e.g. copper) 150.1 and some other layer 150.2 underlying the layer 150.1. Layer 150.2 can be a barrier layer formed to prevent intermixing of layer 150.1 with dielectric 140. For example, tungsten, TiW, or tantalum can be used to prevent intermixing of copper with silicon dioxide. In some embodiments, layer 150.2 is the bottom sub-layer of layer 150, and layer 150.2 is not solder wettable. Layer 150.2 is etched away to expose the solder wettable layer before the contacts 150C are soldered to substrate 410. In some embodiments, layer 150.2 is etched away during the backside etch of substrate 110 and dielectric 140. For example, if substrate 110 is silicon, dielectric 140 is silicon dioxide, layer 150.2 is tungsten, TiW or tantalum, and layer 150.1 is copper, then the backside etch may involve simultaneous etching of silicon 110, oxide 140, and layer 150.2 with a fluorine plasma (e.g. $CF_4$) as described above.

Alternatively, the layer 150.2 can be removed separately after the backside etch of substrate 110 and dielectric 140. For example, layer 150.2 can be dissolved by a solder flux or the solder, or can be removed in a separate etching step before the solder flux or the solder are deposited.

Solder 420 is deposited in sufficient quantities to reach and cover a portion of the vertical surface 150V of each contact 150C. See FIG. 4. Consequently, the solder bond is stronger because any mechanical forces that may pull the die or wafer 104 upward must overcome the sheer friction force at the interface between the vertical surface 150V and the solder before the solder bond can be broken. (Such "pull-up" mechanical forces can be generated by thermal cycling or during handling.) The solder portions on the vertical surfaces 150V also protect the solder bond if the wafer or die 104 is pulled sideways.

Solder 420 can be replaced with a conductive or anisotropic adhesive. The anisotropic adhesive may fill the entire space between substrates 110 and 410.

Many variations of the above process are possible. For example, when die or wafer 104 has been attached to substrate 410, a dielectric adhesive can be introduced between the die or wafer 104 and substrate 410. Before the die or wafer 104 is attached to substrate 410, a dielectric can be formed on the bottom portion of substrate 110. The dielectric can be grown selectively as described in the aforementioned U.S. Pat. No. 6,184,060. Alternatively, the dielectric can be formed by depositing a flowable material, e.g. polyimide (not shown), over the wafer backside, curing the material, and etching the material with a blanket etch, as described in the aforementioned U.S. Pat. No. 6,322,903. The material is thinner over the contacts 150C than over the backside surface of substrate 110, and the etch of the material exposes the contacts 150C without exposing the substrate. In some embodiments, the etch of the material exposes some of the dielectric 140P, and causes the dielectric 140P to protrude from the material.

Figure 6:
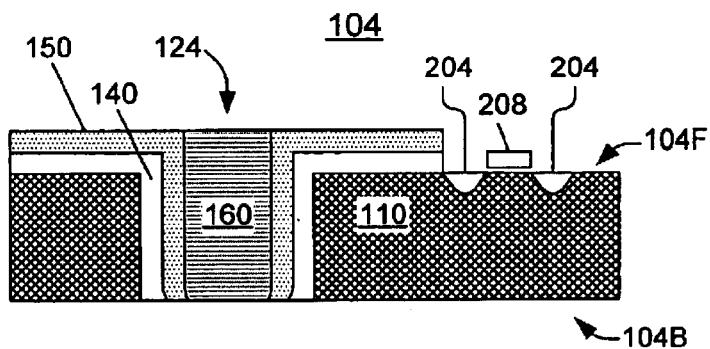

The backside etch can be preceded by backside grinding of substrate 110. In some embodiments, the grinding terminates before the dielectric 140 is exposed. Alternatively, the grinding may expose dielectric 140, and possibly even the conductive layers 150 and 160. See FIG. 6, and see U.S. patent application Ser. No. 09/792,311 filed Feb. 22, 2001 by P. Halahan et al., entitled "Semiconductor Structures Having Multiple Conductive Layers In An Opening, And Methods For Fabricating Same", incorporated herein by reference.

Figure 7:
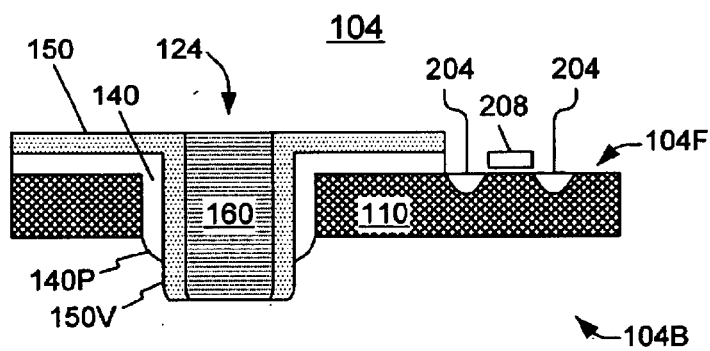

The grinding is followed by a backside etch of substrate 110 and dielectric 140 as in FIG. 3. The resulting structure is shown in FIG. 7. The protruding dielectric 140P may have a convex profile if before the etch the dielectric layer 140 was thicker (wider) at the bottom. See FIG. 6. More generally, the shape of protruding dielectric 140P may depend on the profile of dielectric 140 before the etch, on the etching process, and possibly other factors which may or may not be understood at this time. For example, the etch may include several etching steps with different ratios of the vertical etch rate to the horizontal etch rate, and the exact etch rate ratios may affect the profile of portions 140P. The invention is not limited to any particular profile of dielectric portions 140P or any backside processing techniques.

Figure 8:
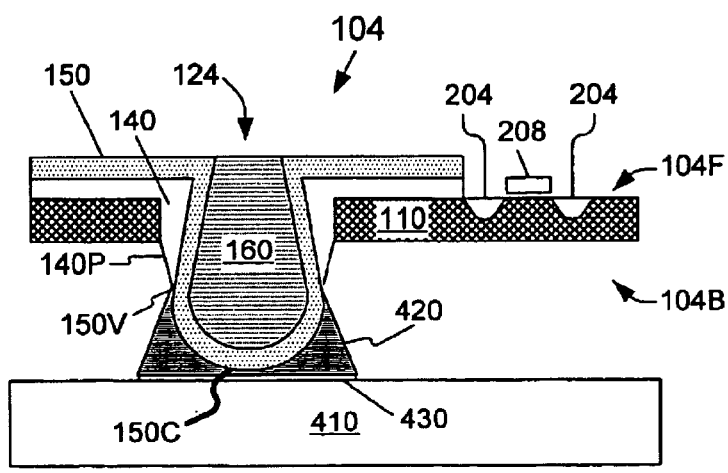
FIGS. 8–10 each illustrate a cross section of an integrated circuit attached to a substrate.
Figure 9:
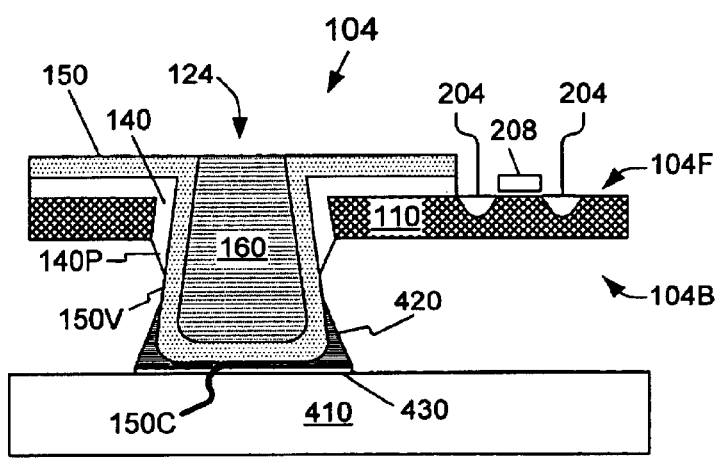

In FIG. 8, the surface 150V of conductive layer 150 is not vertical but is sloped outwards with respect to through hole 124 as the surface 150V is traced down. The sloped profile can be achieved by depositing the dielectric 140 so that, at the stage of FIG. 2, the dielectric 140 gets thinner when traced in the downward direction along the sidewalls of openings 124. In the structure of FIG. 9, the sloped profile of surface 150V is achieved by forming the openings 124 such that their sidewalls expand outwards as they go down. Techniques for forming such openings are well known.

Sloped, expanding sidewalls 150V firmly anchor the layer 150 in substrate 110. Layer 150 is therefore less likely to separate from the wafer if contacts 150C are pushed up relative to the substrate. The contacts can be pushed by an upward force applied to substrate 410 or a downward force applied to substrate 110, or by forces generated by the thermal expansion of solder 420, or possibly for other reasons.

Solder 420 reaches around the widest part of contacts 150C and covers a portion of sloped surface 150V. The solder bond is strengthened as a result.

Figure 10:
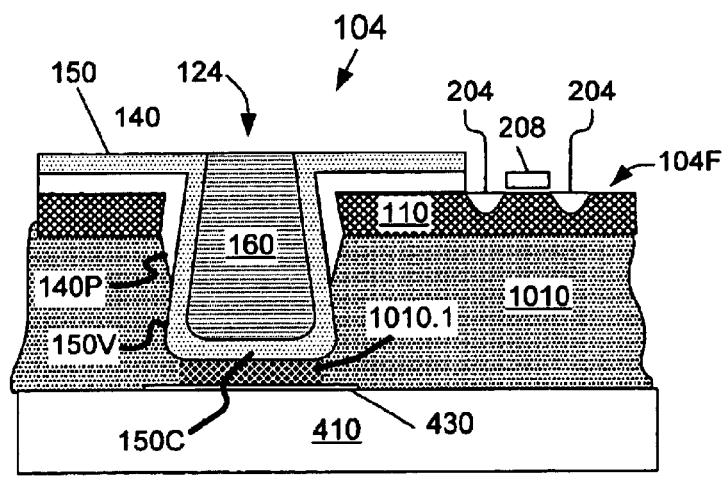

If a dielectric adhesive fills the space between the die or wafer 104 and substrate 410, the expanding contacts 150C anchor the layer 150 in the adhesive, further strengthening the structure. A similar advantage is obtained when solder 420 is replaced with anisotropic adhesive 1010 (FIG. 10). Adhesive 1010 reaches around the widest part of contacts 150C and covers a portion of sloped surface 150V. In FIG. 10, the adhesive 1010 fills the entire space between the die or wafer 104 and substrate 410. Adhesive 1010 is generally dielectric but has a conductive portion 1010.1 between each contact 150C and the corresponding contact 430. Portions 1010.1 become conductive when contacts 150C and 430 are pressed against each other in the process of bonding the die or wafer 104 to substrate 410.

Figure 11:
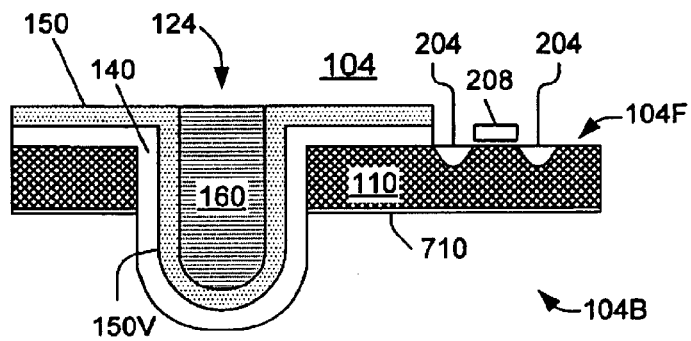
FIGS. 11–13 illustrate cross sections of integrated circuits in the process of fabrication.
Figure 12:
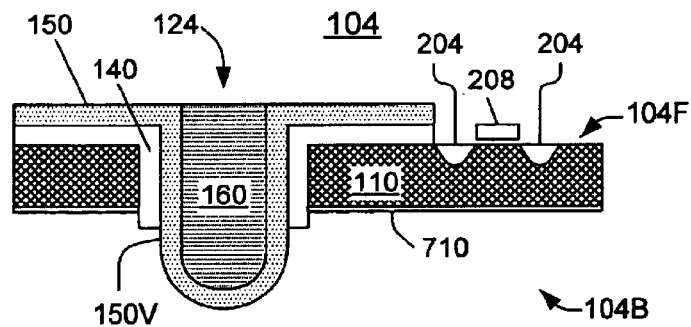

In FIG. 11, the backside processing of wafer 104 is performed as in the aforementioned U.S. Pat. No. 6,322,903. The backside etch of substrate 110 exposes the dielectric 140 but not the conductive layer 150. Then a flowable dielectric 710, e.g. polyimide, is deposited on the backside (with the backside facing up), cured, and etched with a blanket etch selectively to dielectric 140. Dielectric 140 protrudes from the surface of the polyimide 710 at the location of the backside contacts. Then dielectric 140 is etched, possibly selectively to dielectric 710, until the surface 150V of layer 150 is exposed. See FIG. 12. Surface 150V can be vertical or sloped outwards as in FIG. 8. In FIG. 12, dielectric 140 does not become gradually thinner around the contacts 150C.

Figure 13:
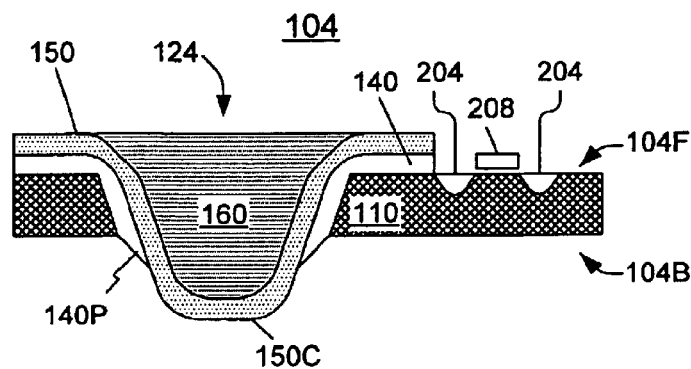

The embodiments described above illustrate but do not limit the invention. In FIG. 13, the protruding portions of dielectric 140P become gradually thinner around the contact 150C, but the sidewalls of layer 150 and opening 124 are not vertical nor sloped outwards. The sidewalls are sloped inwards, into the opening, as the sidewalls are traced down. The invention is not limited by particular materials, dimensions, fabrication techniques, or the number of openings 124. The invention is defined by the appended claims. In the claims, the terms "top surface" and "bottom surface" are used to identify the surfaces and their position relative to each other. These terms do not mean that the structures cannot be turned upside down during or after processing, or placed at some other angle, to position the "top surface" below the "bottom surface" or in some other position relative to the "bottom surface".

What is claimed is:

1. A body comprising a semiconductor substrate which has a top surface and a bottom surface, wherein one or more through holes pass through the substrate between the top and bottom surfaces, the body comprising one or more circuit elements formed in and/or over the top surface of the semiconductor substrate;

a conductor formed in each through hole and protruding from the bottom surface of the semiconductor substrate, the conductor in each through hole being coupled to one or more of the circuit elements;

a dielectric separating the conductor in each through hole from the semiconductor substrate, wherein at each through hole the dielectric forms a protrusion on the bottom of the body around the conductor;

wherein at each through hole the conductor protrudes from the dielectric on the bottom of the body, the conductor thus having a protruding outer surface not covered by the dielectric, wherein at least a portion of the protruding outer surface is either vertical or sloped outwards, laterally away from the through hole, when the surface is traced down;

wherein throughout each protrusion formed by the dielectric, the dielectric becomes gradually thinner around the adjacent conductor as the protrusion is traced down.

2. An integrated circuit structure comprising:

a body comprising a semiconductor substrate which has a first surface and a second surface, wherein one or more through holes pass through the substrate between the first and second surfaces, the body comprising one or more circuit elements formed in and/or over the first surface of the semiconductor substrate;

a conductor formed in each through hole and protruding from a bottom surface of the semiconductor substrate, the conductor in each through hole being coupled to one or more of the circuit elements;

a dielectric separating the conductor in each through hole from the semiconductor substrate, wherein at each through hole the dielectric forms a protrusion on the bottom surface of the body around the conductor;

wherein throughout each protrusion formed by the dielectric, the dielectric becomes gradually thinner around the adjacent conductor as the protrusion is traced down.

3. The integrated circuit structure of claim 2 wherein at each through hole the conductor protrudes from the dielectric on the bottom surface of the body.

4. The integrated circuit structure of claim 2 in combination with a first substrate, wherein a protruding portion of each protruding conductor is attached to the first substrate.

* * * * *